United States Patent [19]

Ogata et al.

[11] Patent Number: 5,296,724

[45] Date of Patent: Mar. 22, 1994

[54] LIGHT EMITTING SEMICONDUCTOR DEVICE HAVING AN OPTICAL ELEMENT

[75] Inventors: Shiro Ogata, Nishigyo; Koichi Imanaka, Minami; Hiroshi Goto, Yamatokoriyama; Yoshinori Ito, Takatsuki; Kourou Kitajima, Higashiyodogawa, all of Japan

[73] Assignee: Omron Corporation, Kyoto, Japan

[21] Appl. No.: 692,901

[22] Filed: Apr. 29, 1991

[30] Foreign Application Priority Data

| Apr. 27, 1990 [JP] | Japan | 2-46394[U] |
| Apr. 27, 1990 [JP] | Japan | 2-112892 |
| May 22, 1990 [JP] | Japan | 2-131550 |
| Aug. 10, 1990 [JP] | Japan | 2-85100[U] |

[51] Int. Cl.$^5$ ............................................. H01L 33/00
[52] U.S. Cl. ...................................... 257/98; 257/99; 257/680; 257/684; 257/702; 257/704
[58] Field of Search ........................ 357/17; 257/98, 99, 257/680, 684, 702, 704

[56] References Cited

U.S. PATENT DOCUMENTS 4,861,137  8/1989  Nagata ............................... 357/17

FOREIGN PATENT DOCUMENTS

| 021473  | 7/1981 | European Pat. Off. |
| 87167   | 8/1983 | European Pat. Off. |
| 2023928 | 1/1980 | United Kingdom |

OTHER PUBLICATIONS

Patent Abstracts of Japan, vol. 10, No. 343 (E-456) (2399), Nov. 19, 1986 (61-145876).
Patent Abstracts of Japan, vol. 11, No. 384 (E-565), Dec. 15, 1987 (62-150894).
Patent Abstracts of Japan, vol. 11, No. 314 (E-549), Oct. 13, 1987 (62-108585).

*Primary Examiner*—Edward Wojcieshowicz
*Attorney, Agent, or Firm*—Dickstein, Shapiro & Morin

[57] ABSTRACT

A light emitting semiconductor device including a light emitting element, an optical element for condensing, collimating or diverging a ray emitted from the light emitting element which is packaged as a single unit with the light emitting element, and a cap molded by a fiber reinforced resin for supporting the light emitting element, the cap having an opening for a light emitting window which is provided with the optical element.

30 Claims, 13 Drawing Sheets

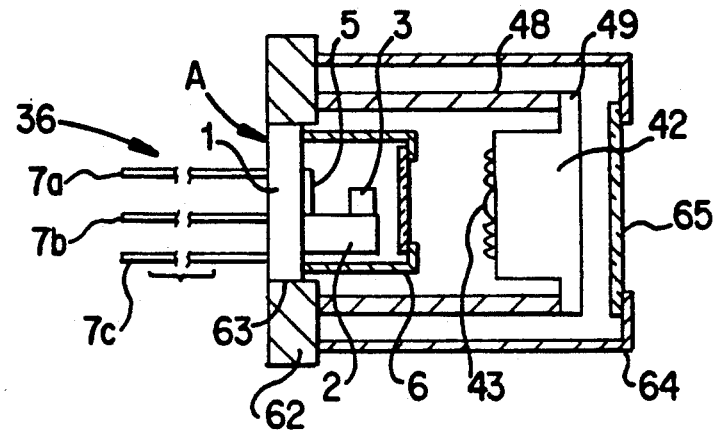

LIGHT EMITTING SEMICONDUCTOR DEVICE HAVING AN OPTICAL ELEMENT

BACKGROUND OF THE INVENTION

1. Field of the Invention

This invention relates to a light emitting semiconductor device having an optical element, and more particularly to an improved light emitting semiconductor device having a light emitting element, such as a semiconductor laser element, a light emitting diode or the like, and an optical element such as a Fresnel lens or the like condense, collimate or diverge a ray emitted from the light emitting element, both elements of which are packaged as a single unit.

2. Discussion of the Related Art

In FIG. 19, there is shown a conventional light emitting element member A including a disk-shaped stem 1 made of metal, a rectangle metal projecting portion 2 formed on a center of a surface of the stem 1, a light emitting element 3 represented by a semiconductor laser element or the like which is mounted on a side wall of projecting portion 2 through a heat sink 4, a light receiving element 5 for monitoring the output of a ray emitted from the light emitting element 3 to control the output thereof, a metal cap 6 mounted on the stem 1 to cover the elements 3 and 5, and signal and ground terminals 7a through 7c. The pair of signal terminals 7a and 7b are mounted through the stem 1 in an insulated relationship to be electrically connected to light emitting element 3 and light receiving element 5 through wires 8. The ground terminal 7c is planted to stem 1 to be electrically connected thereto and further to elements 3 and 5.

This package type light emitting element member A is conventionally mass-produced and marketed at a reduced price, but has the disadvantages that, when it is employed as an optical pickup or sensor, it must be combined with an optical element such as a Fresnel lens to condense or collimate the diverging emitted light, so that many number of components are assembled and an optical axis is hard to be adjusted.

As illustrated in FIG. 20, the inventors have proposed a light emitting semiconductor device B further including an optical element 9 employing a Fresnel lens for collimating the light emitted from light emitting element 3, in addition to the construction of FIG. 19. A lens base plate 10 has a Fresnel lens at its central position, and its flat portion at a periphery of the lens is bonded to a top of the projecting portion 2 by bond. The distance between lens 9 and light emitting element 3 is adjusted by the thickness of an ultraviolet rays (UV) setting bond for securing the plate 10 to the projecting portion 2.

The light emitting semiconductor device of FIG. 20, however, still has the disadvantages that a focal position of a ray emitted from the light emitting element which has been thus adjusted to a predetermined position is varied by changes of temperatures of circumstances or the light emitting element itself, so that the focal distance of the device is unstable against temperatures. Such a poor temperature stability of the focal distance is caused by several reasons.

The primary reason for unstable focal distance is that the projecting portion employed by the light semiconductor device of FIG. 20 for supporting the lens base plate is made of metal having a large coefficient of thermal expansion, so that the distance between the laser chip and the Fresnel lens is delicately changed and the focal position of the ray emitted from the light emitting element is also changed.

The second reason is a change of a luminous wavelength by temperature of the semiconductor laser element. As shown in FIG. 21 illustrating the relation between luminous wavelength L and temperature T of a semiconductor laser element having a central wavelength 780 nm, the luminous wavelength L of the semiconductor laser element is varied by the temperature T of the element itself. The luminous wavelength L is shifted toward a long wavelength as the temperature T rises, but becomes shorter as the temperature T drops. A light emitting diode also has a similar luminous versus temperature curve in which its luminous wavelength becomes longer as a temperature of the diode rises. As shown in FIGS. 22(a) and (b), the Fresnel lens 9 is a kind of diffraction lens divided into a large number of ring-shaped lenses formed by lens materials, and generally mounted on a lens mounting base plate 10 at its surface. The Fresnel lens 9 provides a similar lens function to a conventional refractor with respect to rays emitted from a light emitting element represented by a semiconductor laser element or a light emitting diode as illustrated in FIGS. 22(a) and (b) exemplarily showing a refracted ray. The lens can be formed of a miniaturized flat and thin plate, so that it plays as a short focus lens suitable to mounting and integrating use, which is easy to be manufactured by a molding process and has a reduced wave surface aberration. Accordingly, the Fresnel lens 9 can be used as a micro Fresnel lens in combination with a light emitting element employing a semiconductor laser element or a light emitting diode.

Since Fresnel lens is a lens utilizing diffraction phenomenon, a diffraction angle of a ray passing through Fresnel lens varies as an incident wavelength L varies, so that the focal position or distance F is fairly changed by the incident wavelength L. The focal distance F versus incident wavelength L is expressed by the following equation:

$$F = (Lo/L) \cdot Fo \quad (1)$$

L: incident wavelength
F: focal distance of incident ray
Lo: designed wavelength of Fresnel lens
Fo: designed focal distance of Fresnel lens When a change of focal distance F is expressed by "f" as incident wavelength L is changed by "l", the change f is expressed by the following equation based on the above equation (1):

$$f = -f \cdot l/L \quad (2)$$

FIG. 23 shows a curve representing the relation between focal distance of Fresnel lens F and incident wavelength L expressed by the equation (1), in which the focal distance F is shortened as the incident wavelength L becomes longer but lengthened as the wavelength L becomes shorter.

Thus, even if a light emitting semiconductor device having a light emitting element in combination with Fresnel lens is designed to employ a Fresnel lens having the designed focal distance Fo versus the ray having a wavelength Lo emitted from the light emitting element, the focal distance L of Fresnel lens varies as the wavelength L of ray emitted from the light emitting element is varied by change of temperature T (hereinafter described as "thermal unstableness of focal distance caused by wavelength change of light emitting element"). For example, as shown in FIG. 24, the focal distance F of Fresnel lens is shortened as the temperature T of the light emitting semiconductor device rises while it is lengthened as the temperature T drops.

Thus, such a proposed light emitting semiconductor device is subject to change by temperatures of distance between an light emitting element and an optical element or thermal unstableness of wavelength of light emitting element, so that it has the disadvantages that focal distance or angle of emitting light is changed by temperature. The light emitting semiconductor device had the disadvantages that it cannot provide perfect collimated rays due to temperature change when it is employed as a collimated light source, the focal position is changed by temperature when the light emitting semiconductor device is employed as a condensed light source, and the angle of divergent is changed by temperature when the light emitting semiconductor device is employed as a diverged light source.

SUMMARY OF THE INVENTION

It is, therefore, a primary object of this invention to provide an improved light emitting semiconductor device which has a reduced change of focal distance against change of temperature of circumstance or a light emitting element itself so that it is free from shifting of focal point and temperature changes.

It is another object of this invention to provide a light emitting semiconductor device having a light emitting element and an optical element for condensing, collimating or diverging a ray emitted from the light emitting element which are packaged as a single unit, in which a supporting member of the light emitting element is covered with a cap molded by a fiber reinforced resin, such as glass fiber reinforced resin or carbon fiber reinforced resin, and the cap at its opening for a light emitting window is provided with the optical element.

It is still another object of this invention to provide a light emitting semiconductor device having a light emitting element and an optical element for condensing, collimating or diverging a ray emitted from the light emitting element which are packaged as a single unit, which includes means for decreasing change of angle of a condensing or diverging ray or change of a collimating ray emitted from the light emitting semiconductor device which is accompanied by change of wavelength of a ray emitted from the light emitting element according to change of temperature.

It is a further object of this invention to provide a light emitting semiconductor device having a light emitting element and an optical element, in which the optical element or a lens mounting base plate for mounting the optical element is formed by the material having a large coefficient of thermal expansion to decrease a change of angle of a condensing or diverging ray or a change of a collimating ray emitted from the light emitting semiconductor device which is accompanied by change of wavelength of a ray emitted from the light emitting element according to change of temperature.

It is a still further object of this invention to provide a light emitting semiconductor device having a light emitting element and an optical element, in which a lens mounting base plate for mounting the optical element is formed by a material having a large coefficient of thermal expansion and the distance between fixing positions of the lens mounting base plate and of the optical element is kept for a predetermined distance to decrease a change of angle of a condensing or diverging ray or a change of a collimating ray emitted from the light emitting semiconductor device which is accompanied by a change of wavelength of a ray emitted from the light emitting element according to a change of temperature.

It is a still further object of this invention to provide a light emitting semiconductor device having a light emitting element and an optical element, in which the optical element or a lens mounting base plate for mounting the optical element is formed by a material having a large coefficient of thermal expansion and the distance between fixing positions of the lens mounting base plate and of the optical element is kept for a predetermined distance to decrease a change of angle of a condensing or diverging ray or a change of a collimating ray emitted from the light emitting semiconductor device which is accompanied by a change of wavelength of a ray emitted from the light emitting element according to a change of temperature.

It is still another object of this invention to provide a light emitting semiconductor device having a light emitting element and a flat-shaped optical element for condensing, collimating or diverging rays emitted from the light emitting element which are packaged as a single unit, in which the optical element is made of the material having a larger coefficient of thermal expansion than those of supporting members for the optical element and the light emitting element, and the optical element at a pattern formed surface and its opposite surface is fixed by a supporting member so that thermal expansion and contraction of the optical element by temperature change can be performed with reference to the opposite surface of the optical element.

It is still another object of this invention to provide a light emitting semiconductor device having a light emitting element and a flat-shaped optical element for condensing, collimating or diverging rays emitted from the light emitting element which are packaged as a single unit, in which the optical element and the light emitting element are mounted on a packaging member to arrange the light emitting element to the focal position of the optical element and in which an expansion member is disposed between the package member and either of the elements to vary a relative position between the elements by temperature change.

According to this invention, there is provided a light emitting semiconductor device having a light emitting element and an optical element which are packaged as a single unit, in which the optical element is supported by a cap molded by a fiber reinforced resin having a smaller coefficient of thermal expansion than metal, such as glass fiber reinforced resin or carbon fiber reinforced resin, so that change of the distance between light emitting element and optical element can be minimized and the change of focal position can be reduced.

According to another aspect of this invention, there is provided a light emitting semiconductor device including a means for reducing a change of condensing angle or diverging angle of light from the light source by using expansion or contraction of the optical element or the lens mounting base plate caused by temperature change, so that the change of focal distance of Fresnel lens in accordance with the change of wavelength of ray emitted from the light emitting element as temperature changes is cancelled and the change of condensing or diverging angle of a ray or collimated ray from light source is reduced before or after temperature change, though Fresnel lens and a lens mounting base plate of a conventional light emitting semiconductor device employ lens material such as glass having a small coefficient of thermal expansion to improve a thermal stability of lens itself.

Considering the wavelength change of a light emitting element and the deviation of expansion and contraction of an optical element itself or a lens mounting base which are caused by temperature change, the affection by wavelength change of the light emitting element can be removed and the optical characteristics can be stabilized by adjusting the pattern measurements of the optical element or the relative distance between the light emitting element and optical element.

According to still another aspect of this invention, there is provided a light emitting semiconductor device in which one of light emitting element and optical element is disposed to move toward or from the other element by utilizing expansion and contraction of an expansive member by temperature change because the change of wavelength of a ray emitted from the light emitting element in accordance with temperature change is inevitable. In other words, considering the wavelength change of a light emitting element and the deviation of expansion and contraction of an expansion member by temperature change, the affection by wavelength change of the light emitting element can be removed and the optical characteristics can be stabilized by adjusting the relative distance between light emitting element and optical element.

BRIEF DESCRIPTION OF THE DRAWINGS

The above and other objects, advantages and features of this invention will be more fully understood from the following detailed description of the invention which is provided in conjunction with the following drawings, of which:

FIG. 9 is a sectional view of a eighth embodiment of a light emitting semiconductor device according to this invention;

FIG. 10 is a sectional view of a ninth embodiment of a light emitting semiconductor device according to this invention;

DETAILED DESCRIPTION OF THE INVENTION

Figure 1:
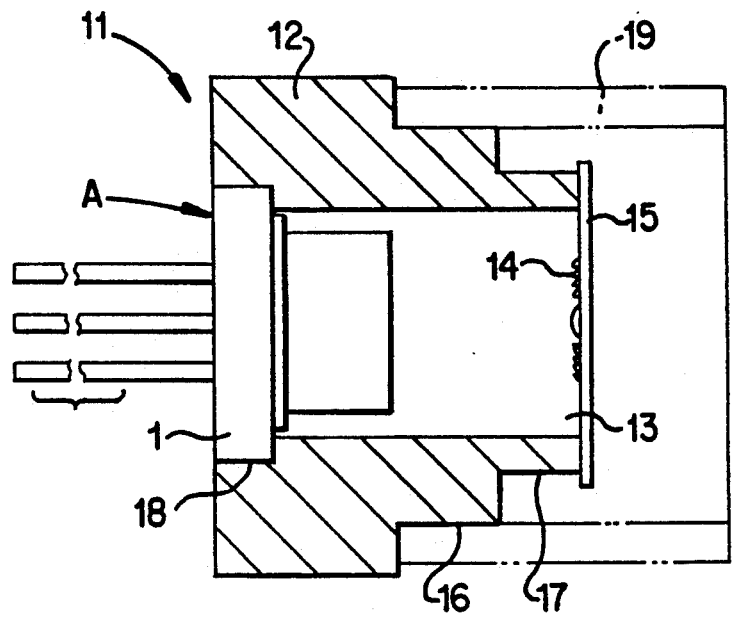
FIG. 1 is a sectional view of a first embodiment of a light emitting semiconductor device according to this invention.
Figure 19:
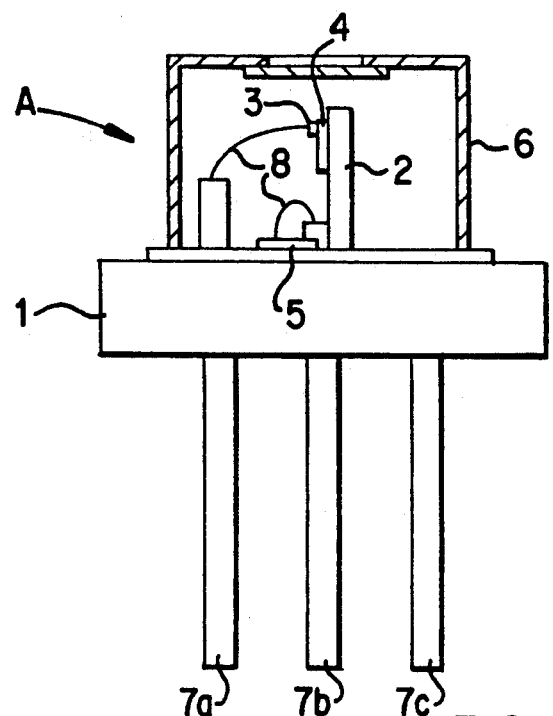
FIG. 19 is a partial sectional front view of a conventional emitting element unit.
Figure 20:
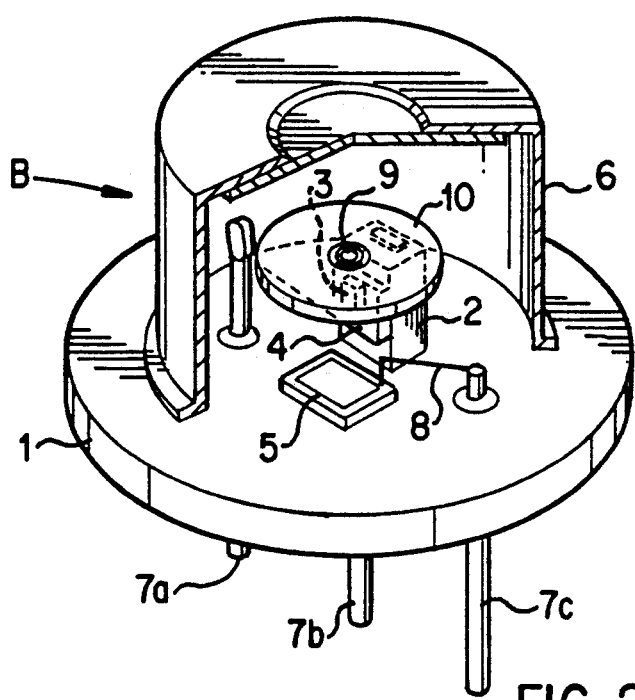
FIG. 20 is a perspective partial sectional view of another conventional light emitting semiconductor device.

Referring to FIG. 1, there is shown a light emitting semiconductor device 11 as a first embodiment according to this invention, in which distance between a light emitting element and an optical element is so designed to be hard to be changed by temperature change. A cap 12 is a molded member of a substantially cylindrical shape which is made of fiber strengthened resin, such as glass fiber strengthened resin, carbon fiber strengthened resin or the like, and is molded by fiber reinforced resin which is thermosetting resin, such as phenol resin, epoxy resin or polyester resin, filled with reinforcing fiber such as glass fiber or carbon fiber. A lower end on an inner surface of the cap 12 is provided with a concave portion 18 for engagement with a stem 1 of a light emitting element member A having an inner construction as shown in FIG. 19. An external cylindrical surface of cap 12 is provided with steps 16 and 17 which have smaller diameters in a direction of a top of the cap. A light projecting window 13 which is an open hole disposed on a top end surface of the cap 12 is bonded by a lens mounting base plate 15 with bond, on an inner wall of which is formed together with a Fresnel lens (micro Fresnel lens) 14 as a single mold unit. Fresnel lens 14 is located at a center of light projecting window 13 in an inner side of cap 12. Since all peripheral of the lens mounting plate 15 is fixed to a top end surface of cap 12 with a precise positioning, the plate 15 is hard to be shifted after bonding the plate 15 to the cap 12.

By inserting the stem 1 of the light emitting element member A into the concave portion 18 (stem 1 and portion 18 may be bonded if necessary) to cover the member A with cap 12, the member A is fixed in a position by concave portion 18 of cap 12 so that a light emitting direction of a light emitting element 3 (FIG. 19) may be aligned with an optical axis of Fresnel lens 14.

The lens mounting base plate 15 of light emitting semiconductor device 11 is externally exposed, and might happen to receive an external mechanical shock. In order to protect the plate 15 from such an external mechanical shock, a cylindrical shaped guard cylinder 19 may be removably mounted (bonded if desired) on step 16 of cap 12 as a simple protecting device. The step 17 is disposed for easily mounting by cylinder 19 and for enabling to catch the plate 15 at its peripheral when it is bonded on the top end of cap 12.

Figure 2:
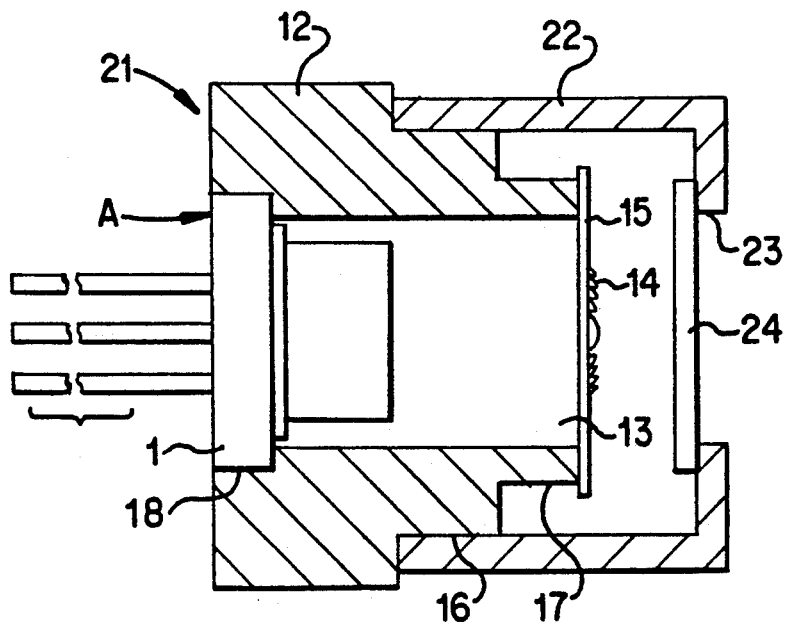
FIG. 2 is a sectional view of a second embodiment of a light emitting semiconductor device according to this invention.

FIG. 2 is a sectional view of a light emitting semiconductor device 21 as a second embodiment of this invention. Fresnel lens 14 is disposed on an external surface of lens mounting base plate 15 bonded on light emitting window 13 of cap 12. Step 16 of cap 12 is covered by synthetic resin cover 22 having a light emitting window 23 closed by a transparent plate 24 made of plastics or glass, so that Fresnel lens 14 disposed outside of plate 15 is protected by cover 22 and plate 24 from external shock or stain.

According to the above-described first and second embodiments, the light emitting semiconductor device is provided at a reduced price by utilizing a cheap light emitting element member in market. Moreover, the distance between light emitting element member and Fresnel lens is defined by a cylindrical length of cap, so that user can combine the light emitting element member with his selected cap on use by preparing various caps having different cylindrical lengths and lens mounting plate. The distance between light emitting element and Fresnel lens and the alignment of axis is accurate because it is defined by dimensions or configurations of caps. The cap is a fiber reinforced resin mold, and can have a reduced thermal expansion and contraction and a fairly reduced shift of focal point. The cap made of resin is easy to be inserted by stem.

Though the light emitting element member is a package type in these first and second embodiments, a cap-removed light emitting element member in which a light emitting element is exposed on an upper surface of the stem may be directly mounted on the fiber reinforced resin cap, if desired.

Figure 3:
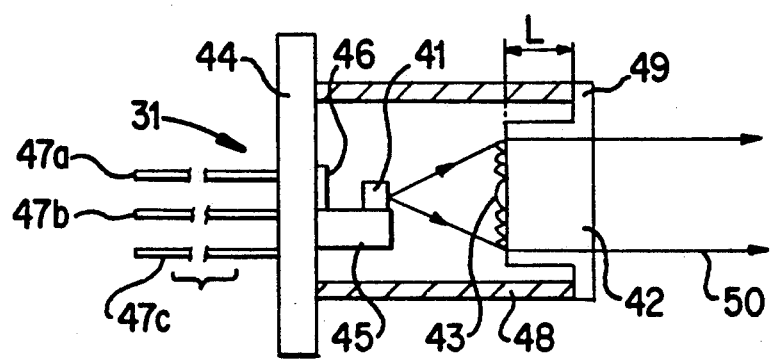
FIG. 3 is a sectional view of a third embodiment of a light emitting semiconductor device according to this invention.

FIG. 3 is a sectional view of a light emitting semiconductor device 31 as a third embodiment of this invention. A metal heat sink block 45 projects from an inner wall of metal stem 44, and a light emitting element (semiconductor laser element) 41 is mounted on an upper surface of block 45. A light receiving element 46 employing a photodiode for monitoring is mounted on the inner wall of stem 44 in alignment with an optical axis of light emitting element 41. The light receiving element 46 may be employed to detect a luminous intensity of laser emitted rearward from light emitting element 41 so that the light emitting element 41 can be controlled by an indirect feed back control for constant photo output from light emitting element 41 based on the detected luminous intensity. Terminals 47a, 47b and 47 are provided for supplying light emitting element 41 with power to control the photo output thereof and for detecting a detection signal from light receiving element 46. A front wall of stem 44 is jointed with a cylindrical metal cap 48 by soldering or bonding to cover light emitting element 41 and heat sink block 45 therewithin. Fresnel lens 43 is formed with a relatively thick lens mounting base 42 as a single unit, and made of optically transparent resin having a large coefficient of thermal expansion (one digit larger coefficient than glass and metal, and 0.0001 order or larger), such as polymethylmethacrylate resin (PMMA) and CR-39 (plastic eye glass lens material). A small Fresnel lens 43 is disposed on a rear end wall of lens mounting base 42 opposing to light emitting element 41, and the base 42 at its flange 49 is bonded with front edge of cap 48 by bond. The light emitting semiconductor device 31 is designed to collimate a ray emitted from light emitting element 41 by Fresnel lens 43 and emit the parallel ray 50, in which the light emitting point of light emitting element 41 is located at the position of focal point of Fresnel lens 43.

As temperature of the light emitting semiconductor device 31 rises, the wavelength of a ray emitted from light emitting element 41 is lengthened and the focal distance of Fresnel lens 43 is shortened, while the focal distance of lens 43 is lengthened by thermal expansion of the lens. Accordingly, the shortened focal distance by change of emitted wavelength of light emitting element 41 may be compensated to be lengthened by thermal expansion of lens 43 so as to reduce the change of whole focal distance of light emitting semiconductor device 31.

Figure 21:
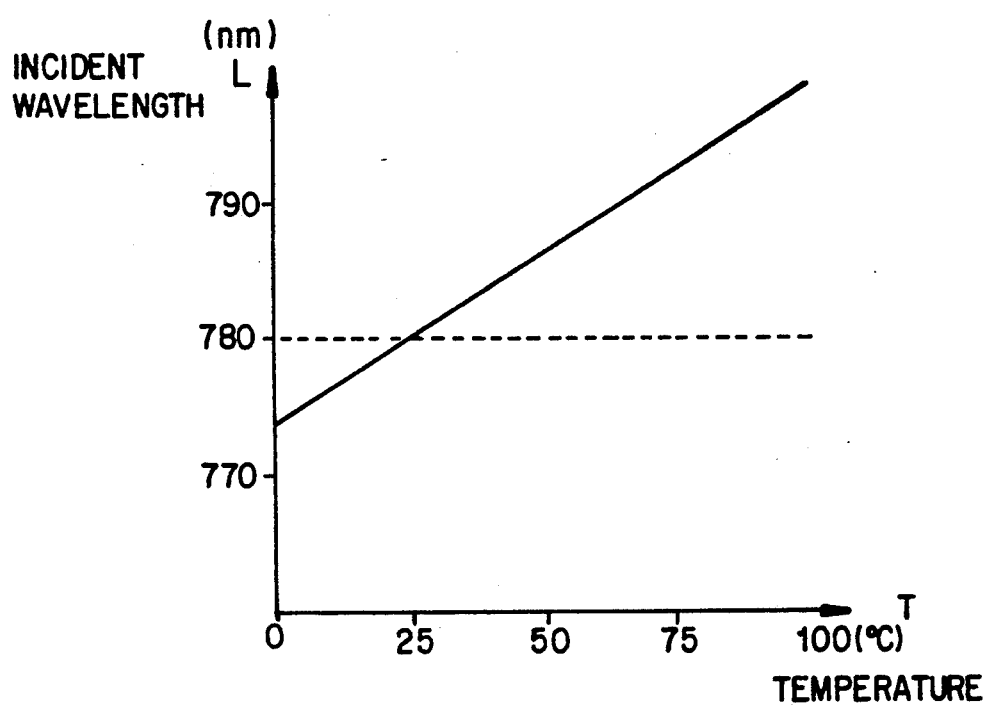
FIG. 21 shows a curve representing luminous wavelength versus temperature characteristics of a semiconductor laser element.
Figure 22A:
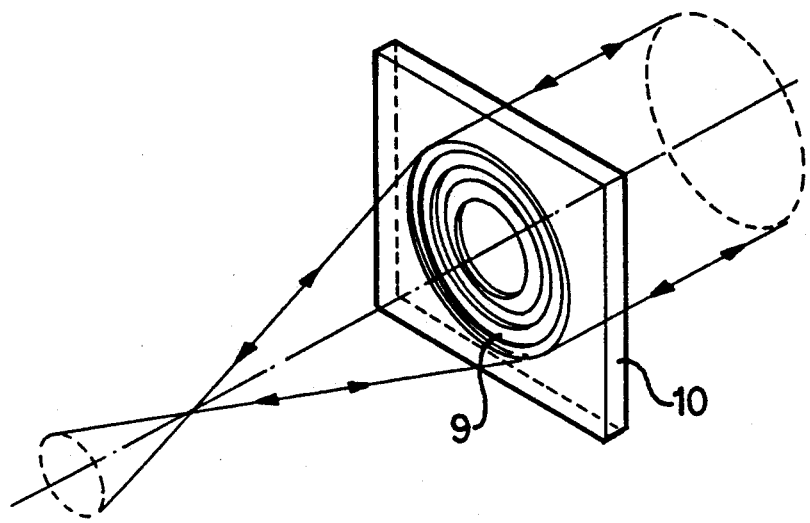
FIGS. 22(a) and (b) show perspective and central sectional views of Fresnel lens.
Figure 22B:
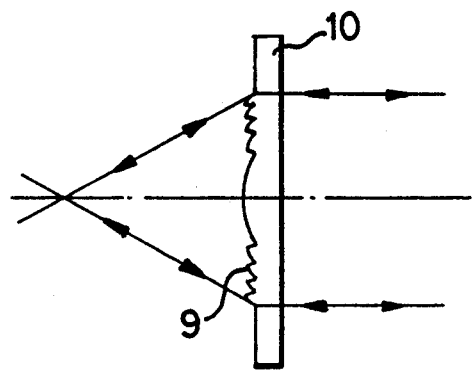
Figure 23:
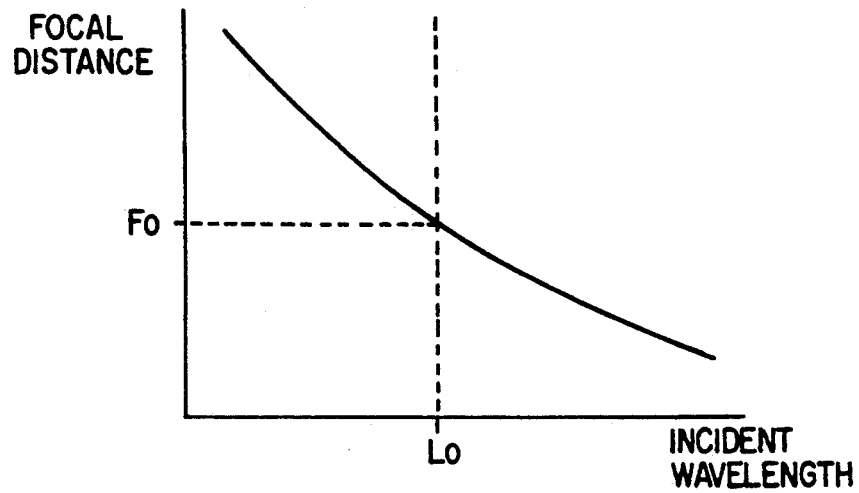
FIG. 23 shows a curve representing focal distance versus incident wavelength of Fresnel lens.
Figure 24:
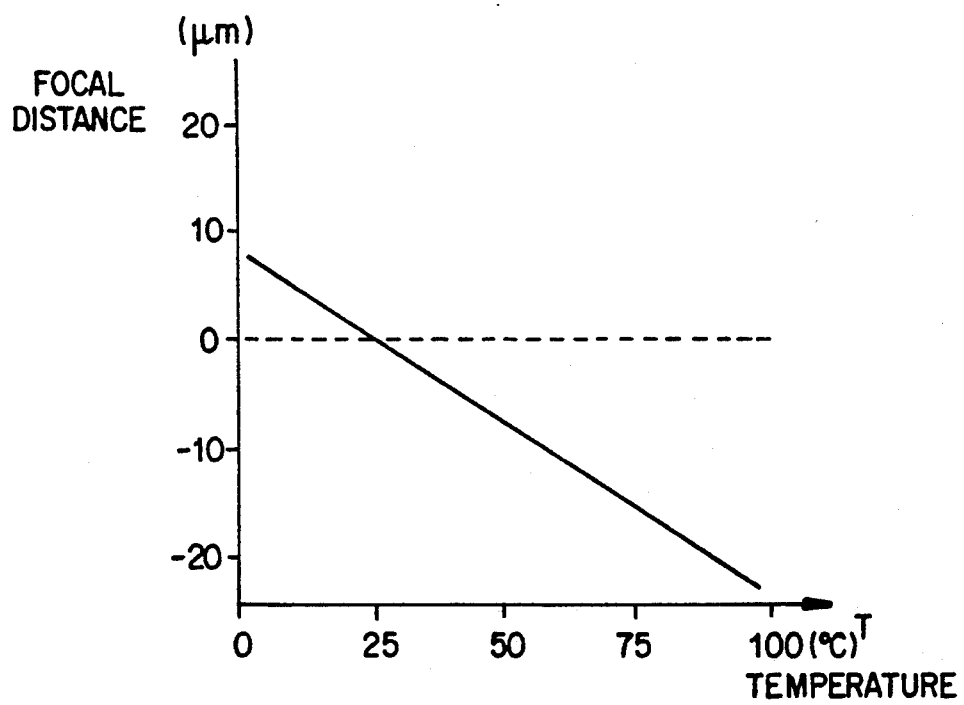
FIG. 24 shows a curve representing deviation of focal distance versus incident wavelength of Fresnel lens.

Assuming that temperature T rises, the wavelength L of a ray emitted from light emitting element becomes longer and the focal distance F of Fresnel lens becomes shorter as illustrated in FIGS. 21 and 23. If the Fresnel lens employs lens material having a large coefficient of thermal expansion, the deviation of focal distance by thermal expansion of Fresnel lens is possible to be enlarged to an extent corresponding to the deviation of focal distance by wavelength change of a ray emitted from light emitting element. As temperature rises, the focal distance is shortened by emitted wavelength of ray of light emitting element but lengthened by thermal expansion of Fresnel lens, so that the change of focal distance of the whole light source is reduced.

As temperature T changes by "t", the focal distance F of Fresnel lens approximately changes by "f" as expressed by the following equation:

$$f = 2aF \cdot t \tag{3}$$

Figure 4:
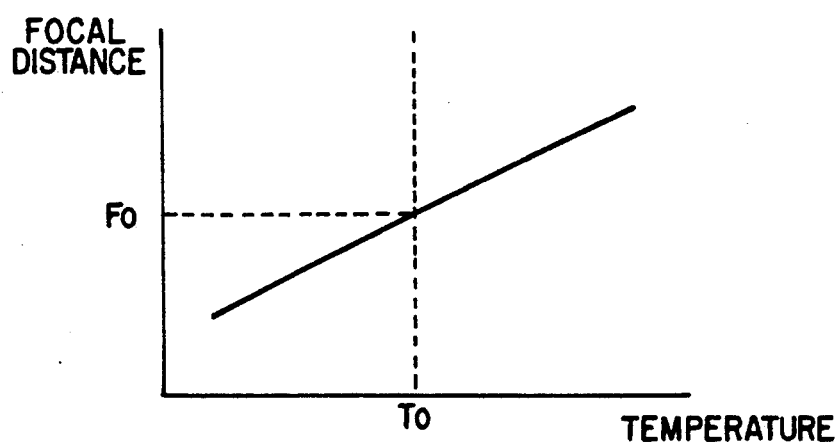
FIG. 4 shows a curve representing change of a focal distance versus temperature of Fresnel lens caused by thermal expansion and contraction of the Fresnel lens.

"a" expresses a coefficient of linear expansion of lens material. FIG. 4 shows a curve representing relation between focal distance F of Fresnel lens versus temperature T. Even if Fresnel lens is designed to have focal distance Fo at temperature To, the focal distance F is lengthened as temperature T rises (hereinafter, described as "temperature unstable of focal distance caused by thermal expansion of Fresnel lens"). As temperature rises, Fresnel lens is thermally expanded to enlarge a lens pattern, diffraction angle at each grid (ring-shaped lens) becomes smaller, and the focal distance is lengthened. If coefficient of thermal expansion of Fresnel lens is large, temperature unstable of focal distance caused by thermal expansion of Fresnel lens is also expanded. Assuming that a temperature change constant of wavelength L of a ray emitted from light emitting element is expressed by "b=1/(L t)", deviation "f" of focal distance F based on change "1" of wavelength L of ray emitted from light emitting element is expressed by the following equation:

$$f = -bF \cdot t \quad (4)$$

In reference to the equations (3) and (4), change of focal distance is expressed as a whole by the following equation:

$$f = (2a-b)F \cdot t \quad (5)$$

If material of Fresnel lens is selected to minimize the value (2a-b) as far as possible, the change of focal distance of light source is minimized. The best coefficient of thermal expansion of the lens material may be experimentally defined if desired.

It is the best way if the change of focal distance can be completely cancelled only by thermal expansion of Fresnel lens 43. It is, however, difficult to select lens material having a certain coefficient of thermal expansion for completely cancelling the change of focal distance of Fresnel lens 43. The light emitting semiconductor device 31 may show the embodiment in which it is impossible to select the lens material having such a large coefficient of thermal expansion to completely cancel the change of focal distance. The light emitting semiconductor device is so designed that the thickness L of lens mounting base 42 formed by material having a large coefficient of thermal expansion is enlarged, Fresnel lens 43 is disposed on a back wall of lens mounting base 42, and the flange 49 of front end of base 42 is secured to cap 48. Thus, the lens mounting base 42 is projected backward and a back wall thereof is provided with Fresnel lens 43, so that Fresnel lens 43 is shifted backward by the thermal expansion of lens mounting base 42 when temperature rises.

In case that lens material having a sufficiently large coefficient of thermal expansion cannot be disposed, the projection wavelength of light emitting element 41 is enlarged and the focal distance of Fresnel lens 43 is shortened when temperature rises, so that the complete cancellation by thermal expansion of Fresnel lens 43 is not performed. As a result, the light emitting point of light emitting element 41 is shifted from the focal point of Fresnel lens 43. In this embodiment, the lens mounting base 42 is designed to have a large thickness L, whereby Fresnel lens 43 is shifted toward light emitting element 41 by degree of shortening of focal distance of Fresnel lens 43 by temperature rise. Thus, a secondary compensation is performed so as to keep the light emitting point of light emitting element 41 at the focal point of Fresnel lens 43. For this secondary compensation, the thickness L of lens mounting base 42 may be designed in view of coefficient of thermal expansion of lens mounting base 42, but change of location of light emitting element 41 by the thermal expansion of heat sink block 45 and the thermal expansion of cap 48 must be considered.

If selection of coefficient of thermal expansion of lens 43 and base 42 can minimize the focal distance change to an extent satisfactory, the base 42 may be designed to have a thin thickness L.

Figure 5:
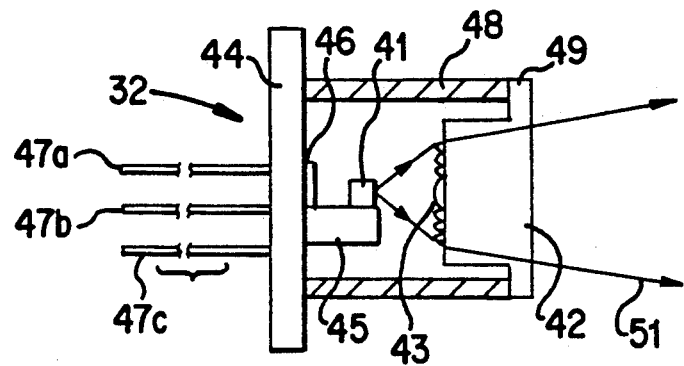
FIG. 5 is a sectional view of a fourth embodiment of a light emitting semiconductor device according to this invention.

FIG. 5 shows a light emitting semiconductor device 32 as a fourth embodiment of this invention. The device 32 projects a diverging ray 51 emitted from light emitting element 41, and has a similar construction to that of the third embodiment except that the distance between light emitting point of light emitting element 41 and Fresnel lens 43 is shorter than the focal distance of lens 43.

Accordingly, as temperature changes, a constant projection angle is maintained by compensating the shortening focal point by change of projection wavelength of light emitting element 41 with the compensation effect of focal distance by thermal expansion of Fresnel lens 43 and the compensation effect of position of lens 43 by thermal expansion of lens mounting base 42.

Figure 6:
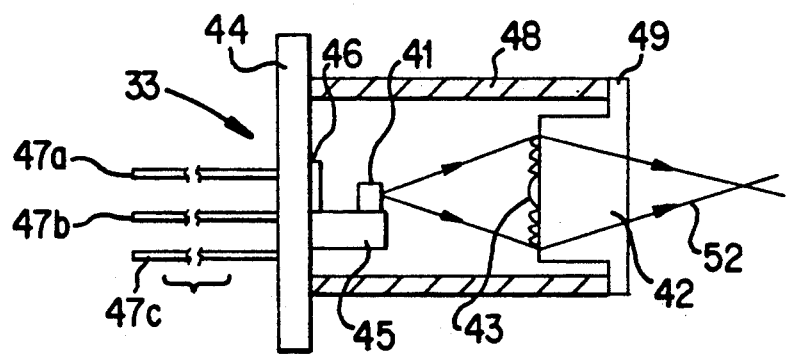
FIG. 6 is a sectional view of a fifth embodiment of a light emitting semiconductor device according to this invention.

FIG. 6 shows a light emitting semiconductor device 33 as a fifth embodiment of this invention. The device 33 projects a condensing ray 52 emitted from light emitting element 41, and has a similar construction to that of the third embodiment except that the distance between light emitting point of light emitting element 41 and Fresnel lens 43 is longer than the focal distance of lens 43.

Accordingly, as temperature changes, a shortening focal point by change of projection wavelength of light emitting element 41 is compensated to keep the focal point at an external fixed position, based on the compensation effect of focal distance by thermal expansion of Fresnel lens 43 and the compensation effect of position of lens 43 by thermal expansion of lens mounting base 42.

Figure 7:
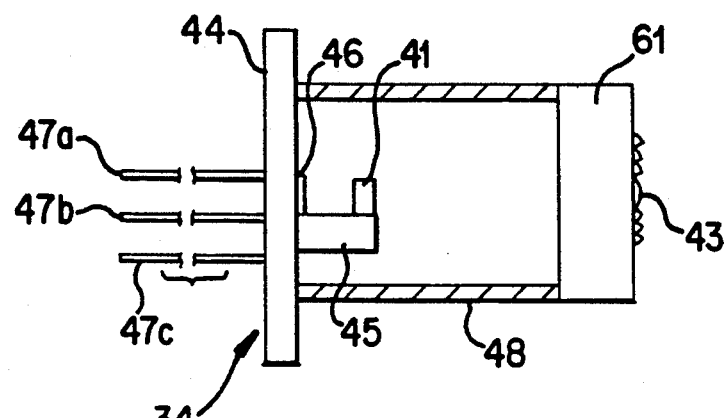
FIG. 7 is a sectional view of a sixth embodiment of a light emitting semiconductor device according to this invention.

FIG. 7 shows a light emitting semiconductor device 34 as a sixth embodiment of this invention, in which a cap 48 at its front end is bonded by a back end wall of a lens mounting base 61 which is formed with Fresnel lens 43 as a single unit by material having a large coefficient of thermal expansion so as to locate the lens 43 on a front wall of base 61. The light emitting semiconductor device 34 is so designed to protect too large coefficient of thermal expansion of Fresnel lens 43 and overcompensation for focal distance of lens 43 by thermal expansion. The lens 43 is shifted by thermal expansion in a thickness direction of lens mounting base 61 so that overcompensation is further secondarily compensated. If temperature rises, focal distance is shortened by change of projection wavelength of light emitting element 41, but overcompensated by thermal expansion of Fresnel lens 43. This light emitting semiconductor device 43 is further so designed that light emitting point of light emitting element 41 is maintained at a predetermined position with respect to Fresnel lens 43 by shifting lens 43 apart from element 41 by thermal expansion of lens mounting base 61 even if a whole focal distance is lengthened.

Figure 8:
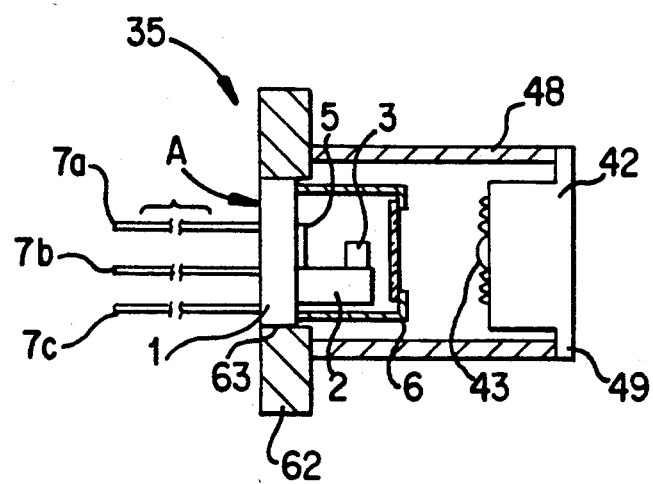
FIG. 8 is a sectional view of a seventh embodiment of a light emitting semiconductor device according to this invention.

FIG. 8 shows a light emitting semiconductor device 35 as a seventh embodiment of this invention, employing a conventional package type light emitting element member A housing semiconductor laser element 3 as shown in FIG. 19 which is available in market. The light emitting member A is secured to base 62 through its hole 63, projecting metal cap 6 forward of base 62. A cylindrical cap 48 is mounted on a front wall of base 62 to house the light emitting member A. Fresnel lens 43 and lens mounting base 42 are formed as a single unit by optically transparent material having a large coefficient of thermal expansion, and a flange 49 of base 42 is bonded on an front end of cap 48.

FIG. 9 shows a light emitting semiconductor device 36 as a eighth embodiment of this invention. The light emitting semiconductor device 36 has a further construction in addition to that of the light emitting semiconductor device of FIG. 8, in which a guard cap 64 is disposed to house cap 48 and lens mounting base 42 to protect a lens member by cap 64 and transparent plate 65 mounted on a window of cap 64.

FIG. 10 shows a light emitting semiconductor device 37 as a ninth embodiment of this invention. In this embodiment, a cylindrical supplemental member 67 having a large coefficient of thermal expansion is disposed to project backward of an inner circular portion of a ring plate 66 mounted on a front end of cap 48, and a rear end of member 67 is bonded by a thin lens mounting plate 68. When a large thickness of lens mounting plate 68 is inconvenient to light waves, secondary compensation about focal distance of lens 43 may be performed by thinning the plate 68 and the thermal expansion and contraction of supplemental member 67 as shown in this embodiment.

Figure 11:
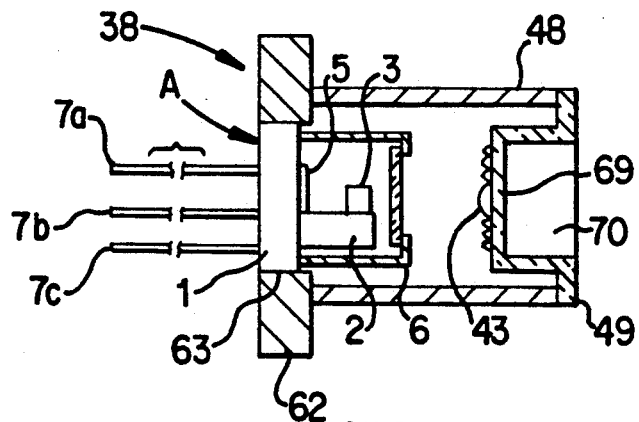
FIG. 11 is a sectional view of a tenth embodiment of a light emitting semiconductor device according to this invention.

FIG. 11 shows a light emitting semiconductor device 38 as a tenth embodiment of this invention, which includes a similar construction to that of the seventh embodiment (FIG. 8) except a lens mounting base construction.

The light emitting element member A is secured to base 62 for allowing the member A to pass through a hole 63 of base 62, and cap 48 is mounted on a front surface of base 62. Fresnel lens 43 and lens mounting base plate 69 are formed as a single unit by optically transparent material, and plate 69 is formed to have a uniform thin thickness without having a large thickness at its center in comparison to flange 49 as shown in FIG. 8. A concave portion 70 is disposed on lens mounting plate 69 at an opposite surface to a lens mounting surface, and a central portion of plate 69 is formed to have a similar thickness to flange 49. By designing to thin the whole lens mounting base 69, the base can be made by injection molding or injection, so that base 69 can be successfully made by resin molding without any defection on the base. Moreover, a resin setting time after molding is reduced, and manufacturing cost is reduced. The center of base 69 is thinned for improving its optical transmission coefficient, so that reduction of power of laser is reduced. The base 69 is made of optical transparent material desirable to have a large coefficient of linear expansion for simplified construction, such as polycarbonate (coefficient: 7/1000000K). If the base 69 has no restriction about dimensions, polyester or polymethyl-methacrylate may be employed.

Figure 12:
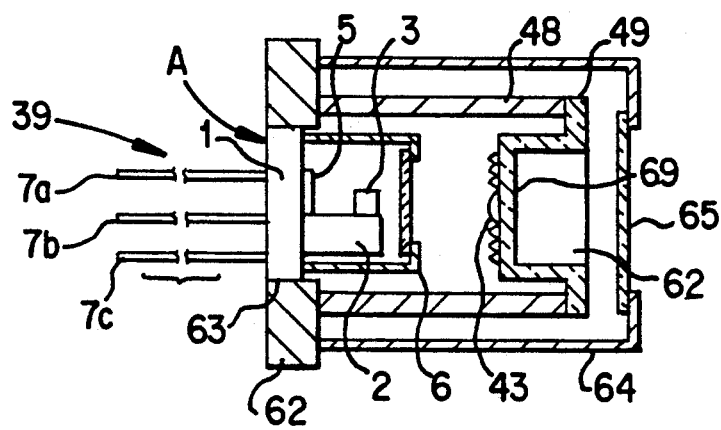
FIG. 12 is a sectional view of a eleventh embodiment of a light emitting semiconductor device according to this invention.

FIG. 12 shows a light emitting semiconductor device 39 as a eleventh embodiment of this invention, which includes in addition to the construction of FIG. 11 a guard cap 64 for housing cap 48 and lens mounting base 69. A transparent plate 65 is mounted on a window of cap 64 to protect a lens member.

Figure 13:
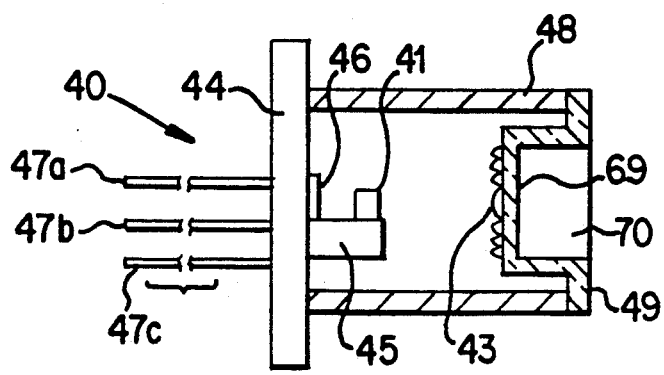
FIG. 13 is a sectional view of a twelfth embodiment of a light emitting semiconductor device according to this invention.

FIG. 13 shows a light emitting semiconductor device 40 as a twelfth embodiment of this invention, which employs lens mounting base 69 having a thin layer construction as described in the third embodiment (FIG. 3). The light emitting semiconductor device may be applied to the construction of the ninth embodiment (FIG. 10) modified by a construction in which lens mounting base 68, ring plate 66 and supplemental construction 67 are molded by a transparent material to make a single lens mounting base unit 69.

In comparison to the embodiment of FIG. 10, the number of components is reduced, and a bonding work for lens mounting base 68, ring plate 66 and supplemental construction 67 is simplified, so that manufacturing process is simplified in this embodiment. The bond material of FIG. 10 brings various unfavorable characteristics in assembled components 68, 66 and 67 to need a very complicated design, but this disadvantage is overcome by a single molding construction of lens mounting base 69.

Though the Fresnel lens and the lens mounting base are formed by material having large coefficients of thermal expansion in the embodiments from the third to twelfth, only the Fresnel lens is designed to have such a large thermal expansion coefficient if desired. If so, Fresnel lens is expanded and contracted in accordance with expansion and contraction of lens mounting base, so that lens pattern is subject to expansion and contraction. Thus, Fresnel lens has a same effect as it is formed by a lens material having a large thermal expansion coefficient. The light emitting element may be represented by a light emitting diode if desired.

Figure 14:
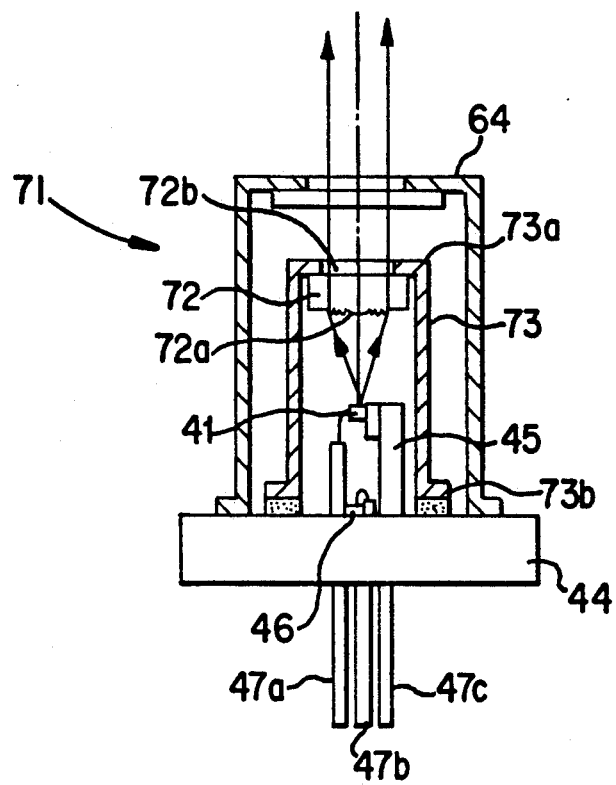
FIG. 14 is a sectional view of a thirteenth embodiment of a light emitting semiconductor device according to this invention.

FIG. 14 shows a light emitting semiconductor device 71 as a thirteenth embodiment of this invention. A flat shaped optical element, Fresnel lens 72, is mounted on a supporting member 73 apart from stem 44. The lens 72 is formed by uneven lens pattern on a surface of a flat molded plastic base. As a molding material, silicon (thermal expansion coefficient: about $2.5 \times 0.0001$/centigrade), p-ethylenglycolbis, or a kind of acrylcarbonate resin made by TPG, CR-39 (thermal expansion coefficient: about $1.1 \times 0.0001$/centigrade) may be selected. The thermal expansion coefficient of Fresnel lens 72 is larger than convectional glass plate ($\times 0.000001$/centigrade) by two digits, and also larger than metal material ($\times 0.000001$/centigrade) for supporting member 73 for lens 72 and stem 44 supporting light emitting element 41.

A cylindrical supporting member 73 at its upper opening has a flange 73a, and at its lower opening has a flange 73b. The flange 73b is bonded or fixed on stem 44, and the flange 73a at its inner surface Fresnel lens 72 so as to bring the emitted light from the light emitting element 41 to lens pattern 72a. The passing wall 72b of lens 72 is fixed on an inner surface of flange 73a.

Dimensions of the supporting member 73 is designed in accordance with the focal distance of lens 72. The circumstance temperature for assembling lens 72 on the member 73 and element 41 on the stem 44 is set to 25 centigrade. The temperature change means deviation in reference to the temperature in assembling work, hereinafter.

As circumstance temperature rises, projection wavelength of light emitting element 41 is lengthened but Fresnel lens 72 is expanded. In reference to upper wall 72b of lens 72 contacted with supporting member 73, the lower wall having lens pattern 72a is expanded to move toward light emitting element 41. As the temperature drops, the projection wavelength of light emitting element 41 is shortened, but the light incident wall 72a of lens 72 is shrunk to move apart from element 41.

The automatic focal distance adjustment of Fresnel lens adjusts the focal position of lens 72 to the light emitting surface of light emitting element 41.

Figure 15:
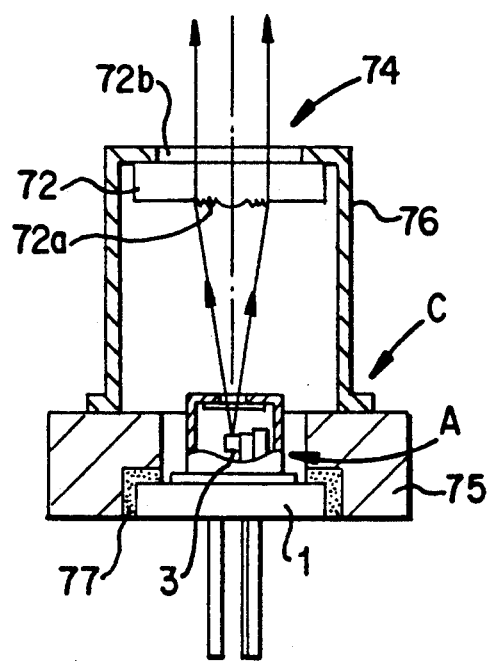
FIG. 15 is a sectional view of a fourteenth embodiment of a light emitting semiconductor device according to this invention.

FIG. 15 shows a light emitting semiconductor device 74 as a fourteenth embodiment of this invention, which employ the light emitting element member A as disclosed in FIG. 19 and a lens unit C.

The lens unit C includes a ring frame 75, an external cap 76, and a Fresnel lens 72, in which cap 76 is mounted to close a hole of frame 75. The lens 72 is secured on an opening window of the external cap 76 through bond. In this embodiment, there is a construction similar to the thirteenth embodiment, in which lens 72 at lens pattern 72a receives ray emitted from light emitting element 3. The external cap 76 corresponds to supporting member 73 of FIG. 14.

Assembling lens unit C and light emitting element member A is performed by inserting member A at its stem 1 into a hole of ring frame 75 to be bonded.

The operation for this embodiment is same as the thirteenth embodiment, and omitted for simplifying explanation.

Figure 16:
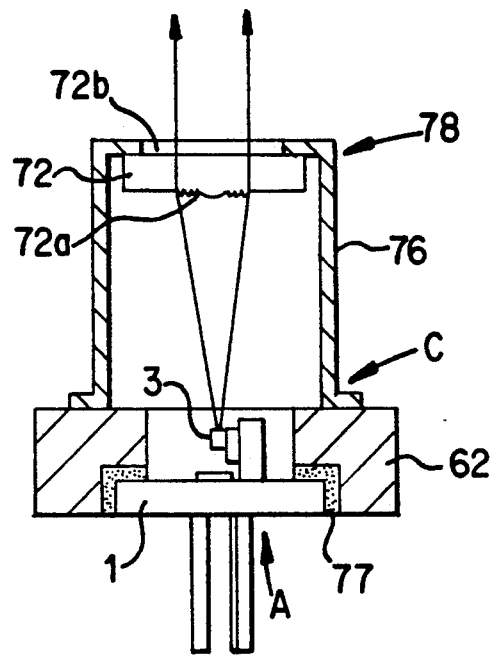
FIG. 16 is a sectional view of a fifteenth embodiment of a light emitting semiconductor device according to this invention.

FIG. 16 shows a light emitting semiconductor device 78 as a fifteenth embodiment of this invention, in which the metal cap 6 is removed from the light emitting element member A and cap-removed member A is mounted in lens unit C. Other components of FIG. 16 are the same as those of the fourteenth embodiment FIG. 15.

If metal cap and transparent plate are removed from a conventional light emitting element member A in market to be mounted on the light emitting semiconductor device 78, light from light emitting element 3 directly reaches the Fresnel lens 72 so as to reduce optical aberration for improved optical characteristics.

Alteratively, a Fresnel lens 72 may be secured to an opening of cap 6 of such a conventional light emitting element member through bond or other joint member.

Figure 17:
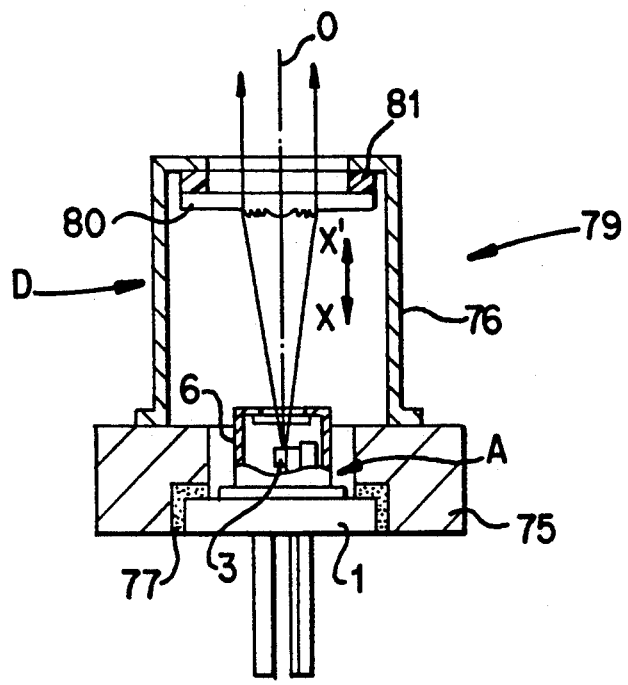
FIG. 17 is a sectional view of a sixteenth embodiment of a light emitting semiconductor device according to this invention.

FIG. 17 shows a light emitting semiconductor device 79 as a sixteenth embodiment of this invention including a conventional light emitting element member A of FIG. 19 and a lens unit D.

The lens unit D includes a ring frame 75, an external cap 76, and a Fresnel lens 80, in which external cap 76 is mounted on frame 75 on its upper wall to close an hole through the frame 75. Lens 80 is fixed to an inner wall of an opening of the external cap 76 through an elastic member 81.

The assembling of lens unit D and element A is performed by bonding, and a chamber of the unit D is filled with stabled gas, such as nitrogen gas.

The elastic member 81 is expanded and contracted by temperature, and employs silicon (thermal expansion coefficient: about 2.5×0.0001/centigrade). By employing such a large thermal expansion coefficient material, the member may be extremely thinned for miniaturized configuration.

As circumstance temperature rises, projection wavelength of light emitting element 3 is lengthened but light emitting element 3 is located at the focal point of Fresnel lens 80 because Fresnel lens 80 is shifted in an arrow X direction along an optical axis O by expansion of the elastic member 81 to come to light emitting element 3. As the temperature drops, the projection wavelength of light emitting element 3 is shortened, but light emitting element 3 is located at the focal point of Fresnel lens 80 because Fresnel lens 80 is shifted in an arrow X' direction along an optical axis O by contraction of the elastic member 81 to move apart from light emitting element 3.

Figure 18:
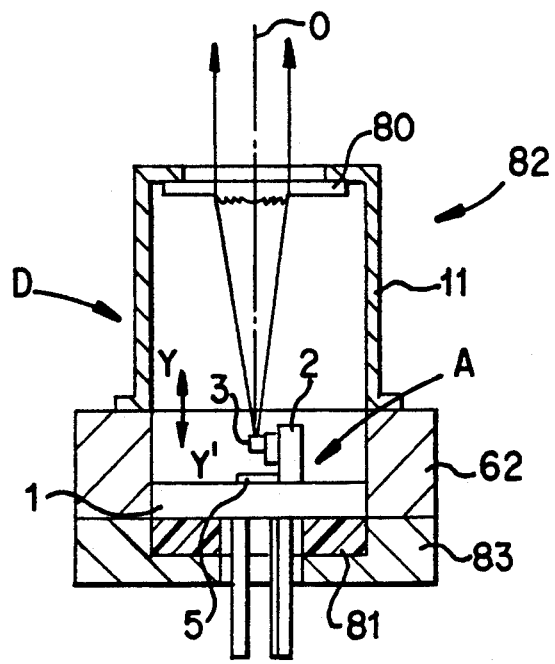
FIG. 18 is a sectional view of a seventeenth embodiment of a light emitting semiconductor device according to this invention.

FIG. 18 shows a light emitting semiconductor device 83 as a seventeenth embodiment of this invention including a conventional light emitting element member A of FIG. 19 a cap of which is removed therefrom, and the cap removed member A is installed to a lens unit D. Ste, 1 of member A is inserted into a hole of a ring frame 62 of the lens unit D. The frame 62 at its lower wall is mounted by a cover 83 having a concave portion inserted by an elastic member 81. Fresnel lens 80 is directly mounted on a opening window of an external cap 11.

As circumstance temperature rises, elastic member 81 expands to slide stem 1 in an arrow mark direction Y within hole of frame 62 and light emitting element 3 moves toward Fresnel lens 80. As the temperature drops, the elastic member 81 shrinks to slide stem 1 in an arrow mark direction Y' within hole of frame 62 and light emitting element 3 moves apart from Fresnel lens 80. Thus, light emitting element 3 is located at the focal point of Fresnel lens 80 in accordance with temperature change.

While preferred embodiments of the invention have been described and illustrated, it should be apparent that many modifications can be made without departing from the spirit and scope of the invention. Accordingly, the invention is not limited by the following description but is only limited by the scope of the appended claims.

What is claimed is:

1. A light emitting semiconductor device comprising:
   a light emitting element;
   an optical element for condensing, collimating or diverging a ray emitted from the light emitting element which is packaged as a single unit with said light emitting element;
   said optical element and light emitting element being responsive to changes in temperature which produce changes in a condensing angle, collimations, or diverging angle of light emitted by said unit; and,
   means for compensating for said temperature induced changes, said compensating means being constructed as at least part of a protective cap which surrounds and protects said light emitting element, said optical element being connected to said protective cap, said protective cap changing a focal distance of said optical element in response to changes in temperature.

2. A device as in claim 1, wherein the focal distance is lengthened as temperature rises.

3. A device as in claim 2, wherein said compensating means is a Fresnel lens which is used as said optical element, said Fresnel lens being thermally expanded as the temperature rises to enlarge its lens pattern.

4. A device as in claim 3, wherein said Fresnel lens has a large coefficient of thermal expansion.

5. A device as in claim 1, wherein said protective cap includes a mounting member for supporting said optical element in said unit, said mounting member being responsive to temperature changes to change the position of said optical element relative to said light emitting element.

6. A device as in claim 5, wherein said optical element is a Fresnel lens mounted on a back wall of said mounting member so that said Fresnel lens faces said light emitting element, said Fresnel lens being shifted relative to said light emitting element by temperature induced expansion of said mounting member to thereby compensate for said temperature induced changes.

7. A device as in claim 6, wherein said unit projects a diverging light ray and wherein a distance between a point of light emission from said light emitting element and said Fresnel lens is shorter than a focal distance of said lens.

8. A device as in claim 6, wherein said unit projects a converging light ray and wherein a distance between a point of light emission from said light emitting element and said Fresnel lens is larger then a focal distance of said lens.

9. A device as in claim 5, wherein said optical element is a Fresnel lens mounted on a front wall of said mounting member so that said Fresnel lens faces the exterior of said unit, said mounting member expanding in a thickness direction in response to temperature variations to compensate for said temperature induced changes.

10. A device as in claim 5, wherein said light emitting element is contained within a protective housing and said optical element receives light from said emitting element through a window in said protective housing.

11. A device as in claim 10, wherein said optical element is a Fresnel lens mounted on a back wall of said mounting member so that said Fresnel lens faces said light emitting element, said Fresnel lens being shifted relative to said light emitting element by temperature induced expansion of said mounting member to thereby compensate for said temperature induced changes.

12. A device as in claim 10, wherein said light emitting element and optical element are both covered by a guard cap having a light passing window therein.

13. A device as in claim 6, wherein said mounting member is supported within said unit by a cylindrical support member having a large coefficient of thermal expansion which expands and contracts with temperature changes.

14. A device as in claim 6, wherein said mounting member has a concave portion on a surface thereof opposite to a surface containing said Fresnel lens.

15. A device as in claim 14, further comprising a guard cap covering said light emitting element, Fresnel lens, and mounting member, said guard cap having a window therein for passing light therethrough.

16. A device as in claim 14, wherein said Fresnel lens and mounting member are integrally molded of a transparent material.

17. A device as in claim 5, wherein said optical element and mounting member are made of materials having a large coefficient of thermal expansion.

18. A device as in claim 5, wherein said optical element is a Fresnel lens which is integrally formed with a plastic base, and said mounting member is a cylindrical support member mounted to a mounting stem for said light emitting element, the distance between said Fresnel lens and light emitting element changing in response to changes in temperature.

19. A device as in claim 1, wherein said optical element is mounted by said protective cap to a ring frame, said light emitting element being mounted within a bore of said ring frame and within said protective cap and directing light to said optical element, said protective cap including a window for passing a light beam from said unit.

20. A device as in claim 5, wherein said optical element is a Fresnel lens and said mounting member includes an elastic member for supporting said Fresnel lens, said elastic member having a large thermal expansion coefficient and expanding and contracting in accordance with changes in temperature.

21. A device as in claim 20, wherein said Fresnel lens is supported to said protective cap by said elastic member, said protective cap having a window for passing light therethrough.

22. A device as in claim 13, wherein said optical element is a Fresnel lens.

23. A device as in claim 22, wherein said Fresnel lens is mounted in a window of said cap.

24. A light emitting semiconductor device comprising:
a light emitting element;
an optical element for condensing, collimating or diverging a ray emitted from the light emitting element which is packaged as a single unit with said light emitting element;
said optical element and light emitting element being responsive to changes in temperature which produce changes in a condensing angle, collimation, or diverging angle of light emitted by said unit; and,
means for compensating for said temperature induced changes, said compensating means changing a focal distance of said optical element in response to changes in temperature, wherein said compensation means comprises an elastic member for supporting said light emitting element within said unit, said elastic member having a large thermal expansion coefficient and expanding and contracting in accordance with temperature changes to thereby change the relative distance between said light emitting element and said optical element.

25. A device as in claim 24, further comprising a cap for said unit which covers said light emitting element and optical element, said optical element being supported to said cap.

26. A light emitting semiconductor device comprising:
a light emitting element;
an optical element for condensing, collimating or diverging a ray emitted from the light emitting element which is packaged as a single unit with said light emitting element;
said optical element and light emitting element being responsive to changes in temperature which produce changes in a condensing angle, collimation, or diverging angle of light emitted by said unit; and,
means for compensating for said temperature induced changes, said compensating means changing a focal distance of said optical element in response to changes in temperature, wherein said compensating means is at least one of the optical element and a lens mounting base plate for mounting the optical element, said compensating means being formed of a material having a large coefficient of thermal expansion.

27. A light emitting semiconductor device comprising:
a light emitting element;
an optical element for condensing, collimating or diverging a ray emitted from the light emitting element which is packaged as a single unit with said light emitting element;
said optical element and light emitting element being responsive to changes in temperature which produce changes in a condensing angle, collimation, or diverging angle of light emitted by said unit; and,
means for compensating for said temperature induced changes, said compensating means changing a focal distance of said optical element in response to changes in temperature, wherein said compensation means comprises a lens mounting base plate for mounting the optical element which is formed of a material having a large coefficient of thermal expansion, and wherein the distance between fixing positions of the lens mounting base plate and of the optical element is maintained at a predetermined distance to decrease a change of angle of a condensing or a diverging ray or a change of a collimating ray emitted from the light emitting semiconductor device which is accompanied by a change of temperature.

28. A light emitting semiconductor device comprising:
   a light emitting element;
   an optical element for condensing, collimating or diverging a ray emitted from the light emitting element which is packaged as a single unit with said light emitting element;
   said optical element and light emitting element being responsive to changes in temperature which produce changes in a condensing angle, collimation, or diverging angle of light emitted by said unit; and,
   means for compensating for said temperature induced changes, said compensating means changing a focal distance of said optical element in response to changes in temperature, wherein said compensating means is at least one of the optical element and a lens mounting base plate for mounting the optical element, said compensating means being formed of a material having a large coefficient of thermal expansion, and wherein the distance between fixing positions of the lens mounting base plate and of the optical element is maintained at a predetermined distance to decrease a change of angle of a condensing or a diverging ray or change of a collimating ray emitted from the light emitting semiconductor device according to a change of temperature.

29. A light emitting semiconductor device comprising:
   a light emitting element,
   a first supporting member for supporting said light emitting element,
   a flat shaped optical element for condensing, collimating or diverging light rays emitted from said light emitting element, said optical element having a pattern formed on one surface which is disposed towards said light emitting element, said optical element being packaged with said light emitting element as a single unit, and
   a second supporting member for supporting said optical element by a surface opposite to the surface on which said pattern is formed, and
   wherein said optical element has a larger coefficient of thermal expansion than said first and second supporting members such that thermal expansion and contraction of said optical element by changes in temperature occur with reference to the surface opposite to the surface on which said pattern is formed.

30. A light emitting semiconductor device comprising
   a light emitting element,
   an optical element for condensing, collimating or diverging light rays emitted from the light emitting element, said optical element being packaged with the light emitting element as a single unit,
   a package member for supporting said optical element and said light emitting element such that said light emitting element is at the focal position of said optical element, and
   an elastic member made of silicone disposed between the package member and at least one of said light emitting element and said optical element to vary the relative position between the light emitting element and optical element due to temperature changes such that changes in the angles of the output rays of the light emitting semiconductor device caused by temperature variations are reduced.

* * * * *